United States Patent
Lin

(10) Patent No.: US 7,876,111 B1
(45) Date of Patent: Jan. 25, 2011

(54) SYSTEM FOR MEASURING OPPOSITE SIDES OF A WIRELESS COMMUNICATION APPARATUS

(75) Inventor: Yung-Chang Lin, Taipei County (TW)

(73) Assignee: Gemtek Technology Co., Ltd., Hsinchu County (TW)

( * ) Notice: Subject to any disclaimer, the term of this patent is extended or adjusted under 35 U.S.C. 154(b) by 0 days.

(21) Appl. No.: 12/880,468

(22) Filed: Sep. 13, 2010

(30) Foreign Application Priority Data

Aug. 13, 2010 (TW) .............................. 99127022 A

(51) Int. Cl.
    *G01R 31/01* (2006.01)
(52) U.S. Cl. ........................... 324/750.22; 324/750.19; 324/754.03
(58) Field of Classification Search ............. 324/754.31
    See application file for complete search history.

(56) References Cited

U.S. PATENT DOCUMENTS

| 7,015,711 | B2 * | 3/2006 | Rothaug et al. | ........ 324/750.02 |
| 7,188,037 | B2 * | 3/2007 | Hidehira | ....................... 702/58 |
| 7,355,417 | B1 * | 4/2008 | Shusterman et al. | ... 324/754.21 |
| 2010/0295569 | A1 * | 11/2010 | Chu et al. | .................... 324/754 |

\* cited by examiner

*Primary Examiner*—Ha Tran T Nguyen
*Assistant Examiner*—Richard Isla Rodas
(74) *Attorney, Agent, or Firm*—WPAT, P.C.; Anthony King

(57) ABSTRACT

A measuring system for testing and measuring a wireless communication apparatus includes a plurality of first probes, a plurality of second probes, and a control module. The first probes are arranged to face toward a first side of the wireless communication apparatus for testing and measuring a plurality of first test points provided on the first side of the wireless communication apparatus. The second probes are arranged to face toward an opposite second side of the wireless communication apparatus for testing and measuring a plurality of second test points provided on the second side of the wireless communication apparatus. The first and second probes detect wireless signals of the wireless communication apparatus via the first and second test points, respectively. The control module is electrically connected to the first probes and the second probes for receiving a plurality of measuring signals transmitted from the first and the second probes.

9 Claims, 4 Drawing Sheets

SYSTEM FOR MEASURING OPPOSITE SIDES OF A WIRELESS COMMUNICATION APPARATUS

FIELD OF THE INVENTION

The present invention relates to a measuring system, and more particularly to a measuring system for simultaneously measuring two opposite sides of a wireless communication apparatus.

BACKGROUND OF THE INVENTION

Currently, a prior art wireless communication apparatus, such as a network interface card, an access point (AP), a router and a multimedia gateway conforming to WLAN 802.11a/b/g, requires related wireless signal test in the manufacturing process thereof, so as to timely locate any defective product and problem in the process of manufacturing. However, according to the currently available test techniques, the test can generally be conducted on the test points provided on only one side of the circuit board of the wireless communication apparatus. In the case a production line engineer wants to test a plurality of different types of signals, he or she has to access the test machine many times and consumes a lot of time. As a result, the test efficiency is low to increase the manufacturing cost.

SUMMARY OF THE INVENTION

A primary object of the present invention is to provide an improved measuring system, so as to overcome the problem of poor efficiency in single-sided test and measurement of a wireless communication apparatus.

To achieve the above and other objects, the measuring system for testing and measuring a wireless communication apparatus according to an embodiment of the present invention includes a plurality of first probes, a plurality of second probes, and a control module. The first probes are arranged to face toward a first side of the wireless communication apparatus for testing and measuring a plurality of first test points provided on the first side of the wireless communication apparatus. The second probes are arranged to face toward an opposite second side of the wireless communication apparatus for testing and measuring a plurality of second test points provided on the second side of the wireless communication apparatus. The control module is electrically connected to the first probes and the second probes for receiving a plurality of measuring signals transmitted from the first and the second probes. The first and second probes detect at least one wireless signal of the wireless communication apparatus via the first and second test points, respectively.

In the present invention, the wireless communication apparatus is a double-sided circuit board.

In the present invention, the first and the second test points include at least one of a power supply point (Vcc), a ground, a signal transmission point, and a wireless signal point.

In the present invention, the control module transmits a test signal to the wireless communication apparatus via one of the first probes and a signal transmission point of the first test points, so that the wireless communication apparatus enters into a test mode.

Alternatively, the control module transmits a test signal to the wireless communication apparatus via one of the second probes and a signal transmission point of the second test points, so that the wireless communication apparatus enters into a test mode.

In the present invention, the plural first probes and the plural second probes detect the wireless signals of the wireless communication apparatus via the wireless signal point of the first test points and the second test points, respectively.

The wireless signals include any one of RF signals and microwave signals.

In the present invention, the plural first probes and the plural second probes detect current signals and voltage signals of the wireless communication apparatus via the power supply point and the ground of the first test points and the second test points, respectively.

In an embodiment of the present invention, the measuring system further includes a fixture for holding the wireless communication apparatus in the measuring system and adjusting the wireless communication apparatus in position to correspond to the first probes and the second probes.

In another embodiment of the present invention, the measuring system further includes a shielding enclosure for enclosing the first probes, the second probes, and the wireless communication apparatus therein, so as to reduce external electromagnetic interference (EMI) therewith.

With the above arrangements, the measuring system of the present invention has the following advantage: probes are provided above and below the wireless communication apparatus to enable simultaneous measurement at the test points provided on two opposite sides of the wireless communication apparatus, enabling upgraded efficiency of testing the wireless communication apparatus in the manufacturing process thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
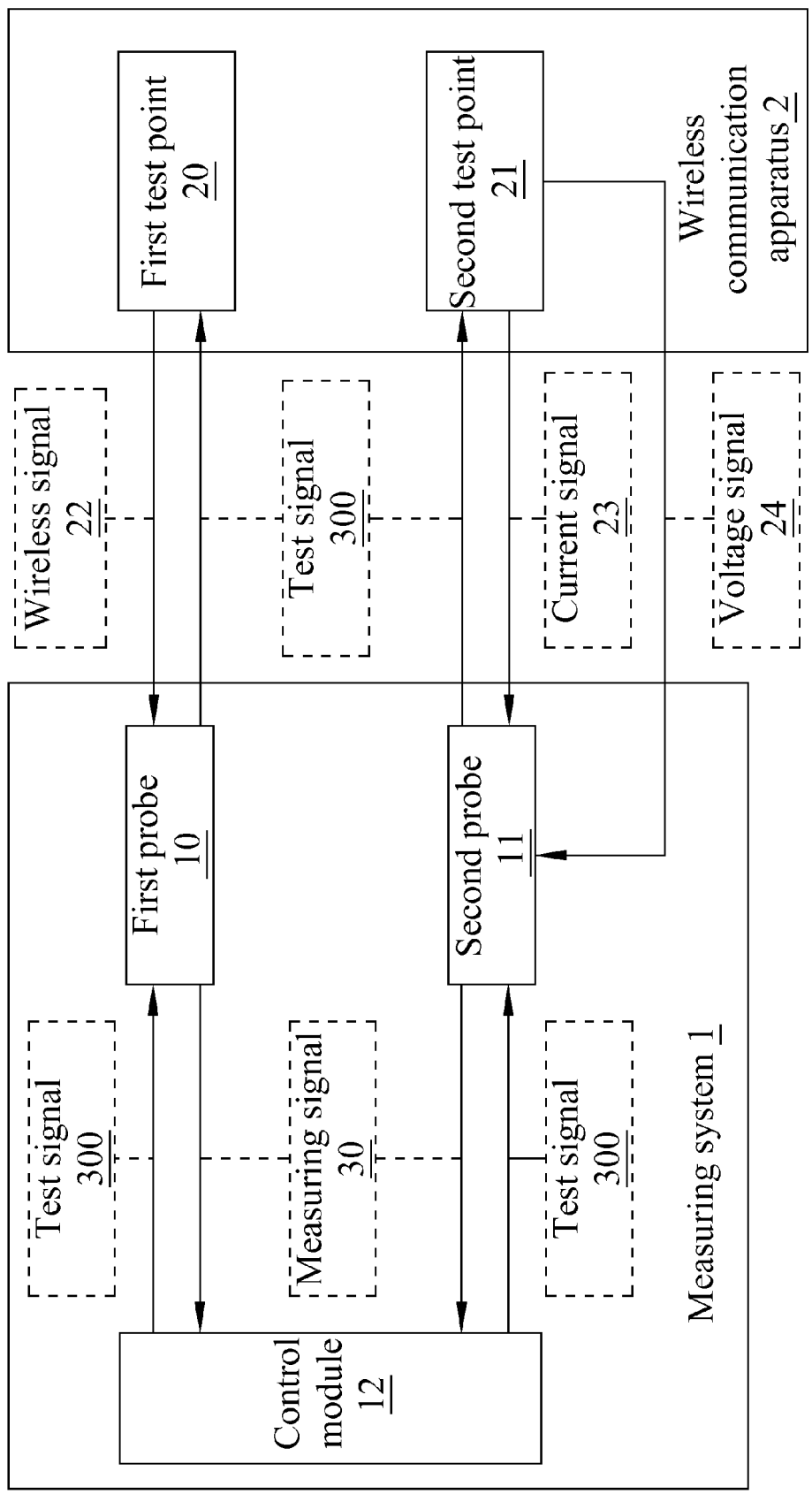
FIG. 1 is a block diagram of a measuring system according to the present invention.
Figure 2:
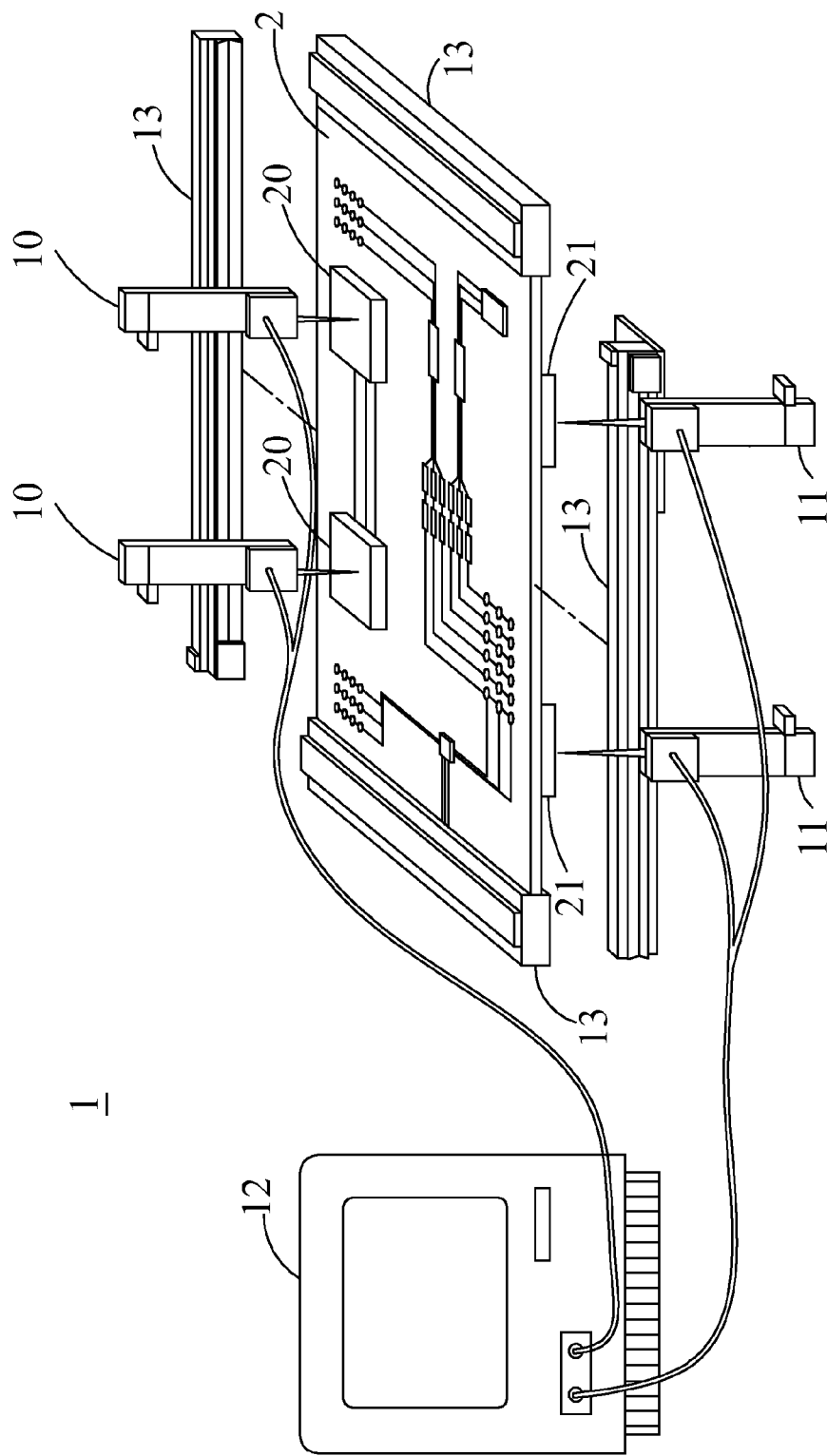
FIG. 2 schematically shows a first embodiment of the measuring system according to the present invention.

Please refer to FIG. 1 that is a block diagram of a measuring system 1 according to the present invention, and to FIG. 2 that is a schematic view of a first embodiment of the measuring system 1. As shown, the measuring system 1 is used to test and measure a wireless communication apparatus 2, and includes a plurality of first probes 10, a plurality of second probes 11 and a control module 12. The first probes 10 are arranged to face toward a first side of the wireless communication apparatus 2 for testing and measuring a plurality of first test points 20 provided thereon. The second probes 11 are arranged to face toward an opposite second side of the wireless communication apparatus 2 for testing and measuring a plurality of second test points 21 provided thereon. The control module 12 is electrically connected to the first probes 10 and the second probes 11 for receiving a plurality of measuring signals 30 transmitted from the first and the second probes 10, 11. The wireless communication apparatus 2 is a double-sided circuit board. The first test points 20 and the second test points 21 include at least one of a power supply point (Vcc), a ground, a signal transmission point and a wireless signal point. The first probes 10 and the second probes 11 detect wireless signals 22 of the wireless communication apparatus 1 via the first test points 20 and the second test points 21, respectively. While the illustrated block diagram of the measuring system 1 only shows that the first probes 10 detect the wireless signals 22 via the first test points 20 without showing that the second probes 11 detect the wireless signals 22 via the second test points 21, the detection of the wireless signals 22 via the second test points 21 by the second probes 11 can be easily achieved by a person of ordinary skill in the field to which the present invention pertains.

The control module 12 transmits a test signal 300 to the wireless communication apparatus 2 via one of the first probes 10 and a signal transmission point of the first test points 20, so that the wireless communication apparatus 2 enters into a test mode and the test begins. Alternatively, the control module 12 transmits the test signal 300 to the wireless communication apparatus 2 via one of the second probes 11 and a signal transmission point of the second test points 21, so that the wireless communication apparatus 2 enters into a test mode and the test begins.

When the wireless communication apparatus 2 enters into the test mode, the first probes 10 and the second probes 11 detect the wireless signals 22 of the wireless communication apparatus 2 via wireless signal points of the first test points 20 and the second test points 21, respectively, and send the detected results back to the control module 12. The wireless signals 22 can be radio frequency (RF) signals or microwave signals. Alternatively, the first probes 10 and the second probes 11 can detect current signals 23 or voltage signals 24 of the wireless communication apparatus 2 via power supply points and grounds of the first test points 20 and the second test points 21, respectively, and send the detected results back to the control module 12. Thus, measuring signals 30 sent back to the control module 12 by the first probes 10 and the second probes 11 include wireless signals 22, current signals 23, or voltage signals 24. The measuring system 1 further includes a fixture 13 for holding the wireless communication apparatus 2 in the measuring system 1, and adjusting the wireless communication apparatus 2 in position to correspond to the plural first probes 10 and second probes 11. The wireless communication apparatus 2 to be measured is first put in the fixture 13, and the fixture 13 is adjusted in position according to the dimensional specifications of the wireless communication apparatus 2 in order to match the positions of the first and the second probes 10, 11. Then, the wireless communication apparatus 2 along with the fixture 13 are sent into the measuring system 1 for measurement. In this manner, it is able to measure various signals at the same time.

Figure 3:
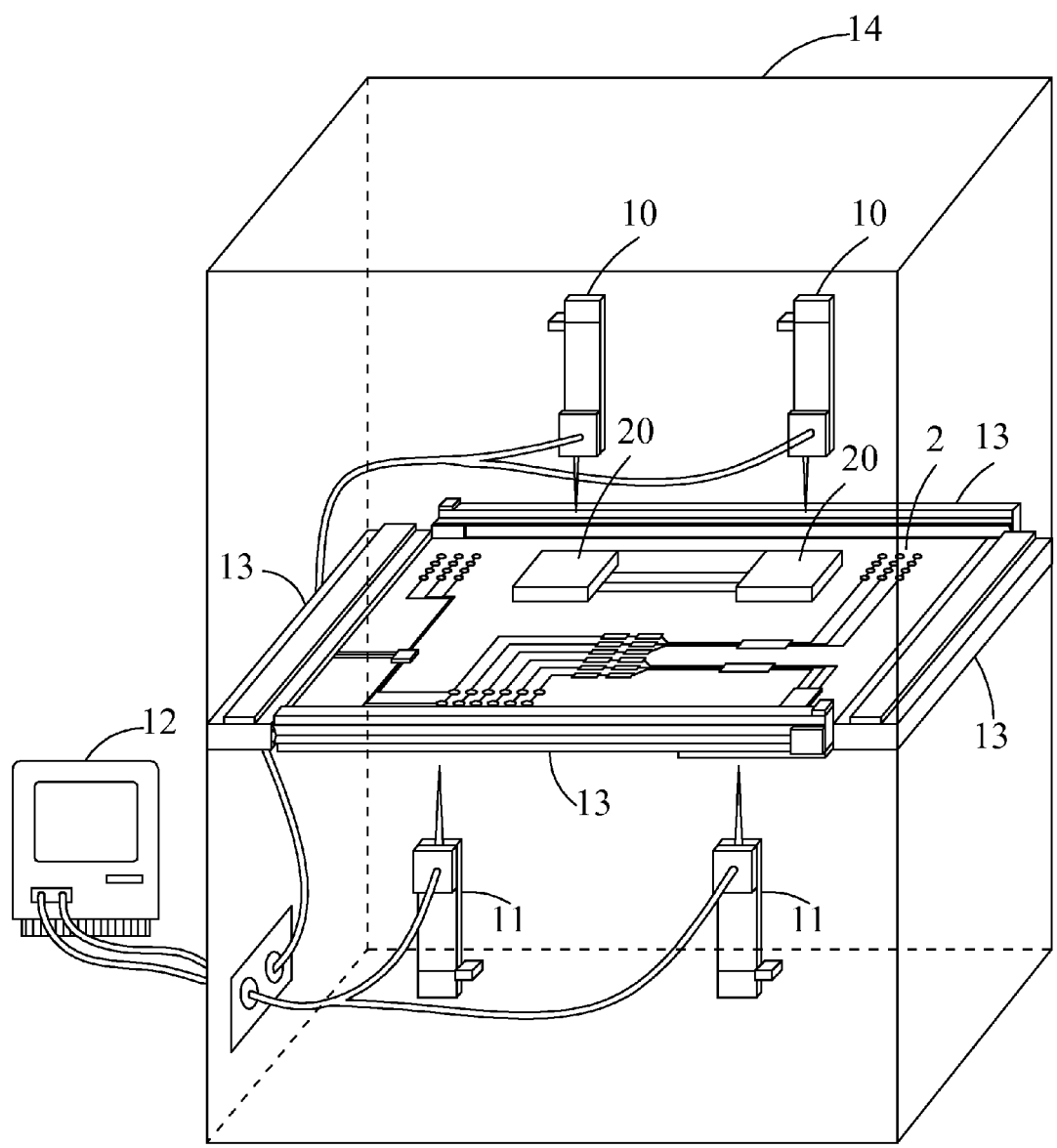
FIG. 3 schematically shows a second embodiment of the measuring system according to the present invention.

Please refer to FIG. 3 that schematically shows a second embodiment of the measuring system according to the present invention. As shown, the second embodiment is different from the first embodiment mainly in a shielding enclosure 14. The shielding enclosure 14 encloses the first probes 10, the second probes 11, and the wireless communication apparatus 2 therein, so as to reduce external electromagnetic interference (EMI) therewith.

Figure 4:
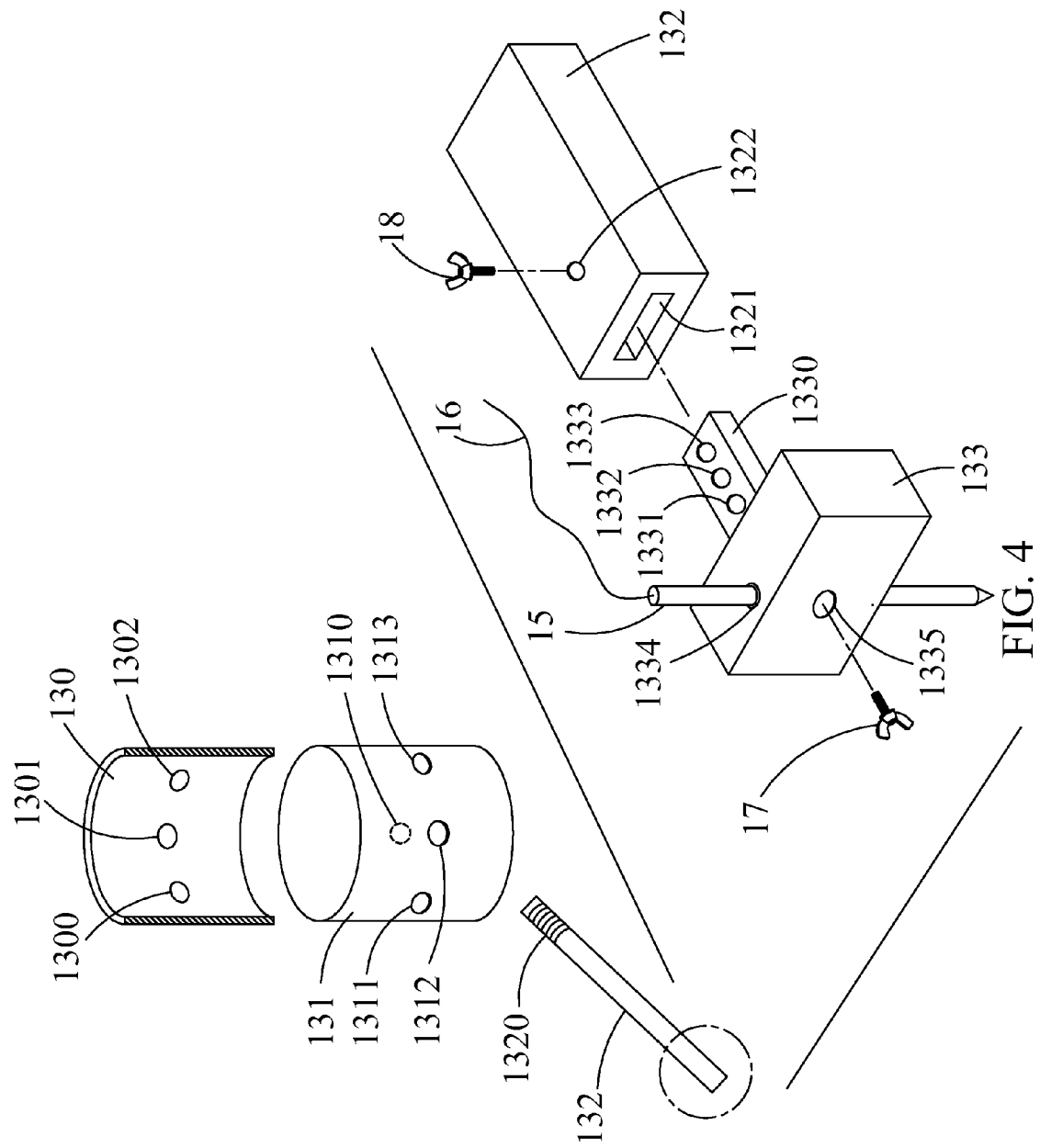
FIG. 4 is an exploded view illustrating how a probe is coupled to a probe fixture in the measuring system of the present invention.

FIG. 4 is an exploded view showing how a probe 15 is coupled to a probe fixture of the measuring system of the present invention. As shown, the probe fixture includes a locating wall 130, a support bearing 131, a support arm 132, and a holder 133. The locating wall 130 is formed at predetermined positions with a plurality of first recesses 1300, 1301, 1302. The support bearing 131 is provided with a steel ball 1310 and a plurality of first threaded holes 1311, 1312, 1313. The support arm 132 has a first end externally provided with a thread 1320, and an opposite second end internally formed into a second recess 1321 with a second threaded hole 1322 formed on a top of the second recess 1321. The holder 133 is provided on one side facing toward the second recess 1321 with a projected section 1330, on a top of which a plurality of third threaded holes 1331, 1332, 1333 are formed. The holder 133 is further provided with a through hole 1334 extended between two opposite sides of the holder 133 in a direction perpendicular to an extending direction of the projected section 1330, and a fourth threaded hole 1335 is provided on a side of the holder 133 opposite to the projected section 1330. The probe 15 has an end connected to a wire 16 for transmitting signals.

The probe 15 is extended through the through hole 1334. A first thumbscrew 17 is screwed into the fourth threaded hole 1335 to detachably press against the probe 15, allowing adjustment of a height position of the probe 15 relative to the holder 133. The holder 133 is adjustably connected to the second end of the support arm 132 by installing the projected section 1330 in the second recess 1321 and screwing a second thumbscrew 18 into the second threaded hole 1322 to detachably engage with any one of the third threaded holes 1331, 1332, 1333 on the projected section 1330, allowing adjustment of a depth by which the projected section 1330 is extended into the second recess 1321 and accordingly, a linear position of the holder 133 relative to the support arm 132. The support arm 132 is adjustably connected to the support bearing 131 at different angular position relative to the support bearing 131 by meshing the thread 1320 at the first end of the support arm 132 with any one of the first threaded holes 1311, 1312, 1313. The support bearing 131 can be further turned about an axis thereof for the steel ball 1310 to move among and finally seat in one of the first recesses 1300, 1301 and 1302, so that the probe 15 connected to the support arm 132 can be adjusted to different positions for detection in all directions. Moreover, the support bearing 131 is partially enclosed in between two opposite edges of the locating wall 130, enabling the support bearing 131 to turn about its axis without separating from the locating wall 130.

With the above arrangements, the measuring system of the present invention provides probes above and below the wireless communication apparatus to enable simultaneous measurement at the test points provided on two opposite sides of the wireless communication apparatus, so that various signals, such as wireless communication signals, current signals and the like, can be measured at the same time to upgrade the efficiency of testing the wireless communication apparatus in the manufacturing process thereof.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A measuring system for testing and measuring a wireless communication apparatus, comprising:

a plurality of first probes being arranged to face toward a first surface of the wireless communication apparatus for testing and measuring a plurality of first test points provided on the first surface of the wireless communication apparatus;

a plurality of second probes being arranged to face toward an opposite second surface of the wireless communication apparatus for testing and measuring a plurality of second test points provided on the second surface of the wireless communication apparatus; and a control module being electrically connected to the first probes and the second probes for receiving a plurality of measuring signals transmitted from the first and the second probes;

wherein the plural first probes and the plural second probes detect at least one wireless signal of the wireless communication apparatus via the plural first test points and the plural second test points, respectively, and wherein the at least one wireless signal includes any one of RF signals and microwave signals.

2. The measuring system as claimed in claim 1, wherein the wireless communication apparatus is a double-sided circuit board.

3. The measuring system as claimed in claim 2, wherein the plural first test points and the plural second test points include at least one of a power supply point (Vcc), a ground, a signal transmission point, and a wireless signal point.

4. The measuring system as claimed in claim 3, wherein the control module transmits a test signal to the wireless communication apparatus via one of the first probes and a signal transmission point of the first test points, so that the wireless communication apparatus enters into a test mode.

5. The measuring system as claimed in claim 3, wherein the control module transmits a test signal to the wireless communication apparatus via one of the second probes and a signal transmission point of the second test points, so that the wireless communication apparatus enters into a test mode.

6. The measuring system as claimed in claim 3, wherein the plural first probes and the plural second probes detect the wireless signals of the wireless communication apparatus via a wireless signal point of the first test points and the second test points, respectively.

7. The measuring system as claimed in claim 3, wherein the plural first probes and the plural second probes detect current signals and voltage signals of the wireless communication apparatus via a power supply point and a ground of the first test points and the second test points, respectively.

8. The measuring system as claimed in claim 1, further comprising a fixture for holding the wireless communication apparatus in the measuring system and adjusting the wireless communication apparatus in position to correspond to the plural first and second probes.

9. The measuring system as claimed in claim 1, further comprising a shielding enclosure for enclosing the first probes, the second probes, and the wireless communication apparatus therein, so as to reduce external electromagnetic interference (EMI) therewith.

* * * * *